United States Patent [19]

Courtney et al.

[11] 4,160,308

[45] Jul. 10, 1979

[54] OPTICALLY COUPLED ISOLATOR DEVICE AND METHOD OF MAKING SAME

[75] Inventors: Thomas Courtney, Redwood City; Vijay K. Lumba, Mountain View, both of Calif.

[73] Assignee: Fairchild Camera and Instrument Corporation, Mountain View, Calif.

[21] Appl. No.: 900,685

[22] Filed: Apr. 27, 1978

Related U.S. Application Data

[62] Division of Ser. No. 654,443, Feb. 2, 1976, abandoned.

[51] Int. Cl.² .......................................... B01J 17/00
[52] U.S. Cl. .................................. 29/588; 29/589; 29/590; 250/551; 250/552; 357/19
[58] Field of Search ............... 29/576 S, 576 J, 588, 29/589, 590; 357/19; 250/551, 552

[56] References Cited

U.S. PATENT DOCUMENTS

| | | | |
|---|---|---|---|
| 3,534,280 | 10/1970 | Biard | 357/19 |
| 3,836,793 | 9/1974 | Haitz | 357/19 |
| 3,845,318 | 10/1974 | Thillays | 357/19 |
| 4,017,963 | 4/1977 | Beyerlein | 29/588 |
| 4,031,606 | 6/1977 | Szonntagh | 29/588 |

*Primary Examiner*—W. Tupman
*Attorney, Agent, or Firm*—Alan H. MacPherson; Robert C. Colwell

[57] ABSTRACT

An improved optically coupled isolator uses a glass layer in combination with layers of junction coat material between the emitter and detector to provide greater electrical isolation while preventing potential ionic contamination in the glass from reaching the detector and causing a deterioration in its operating characteristics. The isolator is assembled using standard semiconductor processing techniques so that the cost of manufacture is not substantially increased.

2 Claims, 11 Drawing Figures

OPTICALLY COUPLED ISOLATOR DEVICE AND METHOD OF MAKING SAME

This is a division, of application Ser. No. 654,443, filed Feb. 2, 1976, now abandoned.

BACKGROUND OF THE INVENTION

1. Field of the Invention

This invention relates to optically coupled isolators, also known as optocouplers, photon couplers, and optoisolators. In particular, this invention relates to a structure for, and a method of manufacture of, an improved optically coupled isolator having relatively high electrical isolation.

2. Description of the Prior Art

Optically coupled isolators consist of two electronic circuits coupled together optically, rather than electrically. Electronic signals are transmitted across an isolation barrier between the two circuits by light, or photons, rather than by electrons. Typically, the isolator comprises a semiconductor emitter, such as a light-emitting diode, in the first circuit and arranged so that its light strikes a semiconductor photon detector, such as a phototransistor, in the second circuit. A transparent insulation fills the space between the emitter and detector, providing electrical isolation. Gallium-arsenide infrared emitters are often used because their 900-nanometer wave-length output falls near the maximum spectral response of the commonly used silicon phototransistor. As both the emitter and detector comprise semiconductors, the isolator is manufactured using standard semiconductor processing techniques, is relatively small in size, and is usually sealed in a small, standard size package.

Some applications for isolators include those where it is desirable to isolate electrically one circuit from another, such as in medical instrumentation. Other applications include those in which it is desirable to transmit an electronic signal between circuits while eliminating noise within the signal, such as in computers and other kinds of switching functions.

The level of applied voltage that can be handled by an isolator without electrical connection between circuits occurring is a function of the distance between the emitter and detector, and a function of the dielectric strength of the transparent insulator located in the space between the detector and emitter. With the need to manufacture isolators economically through the use of standard size packages, such as the small dual-inline package, one is limited in the length of the space available between the detector and emitter. Moreover, if the space becomes too long, the isolator would lose efficiency because of the loss of light energy between the emitter and detector, caused by diffraction, diffusion, reflection, and so forth. Typically, the detector surface facing the emitter is larger than the emitter surface facing the detector in order to ensure that more light will reach the detector. Consequently, for a given length of space between the emitter and detector, the dielectric strength of the insulator in the space determines the isolator's ability to withstand high levels of applied voltage and still maintain electrical isolation. Previously, various kinds of insulation material have been used in the space between the emitter and detector, for example, plastic film such as mylar, and plastic resins such as silicone and epoxy, all of which transmit up to about 95 percent or more of the applied light, and are suitable for semiconductor processing techniques. The typical dielectric strength of many of these materials is on the order of about 500 volts per mil, providing isolators capable of withstanding applied voltages of 2,500 to 3,500 volts. In order to increase the level of applied voltages that the isolator can withstand, it is desirable that the transparent insulation material in the space have a dielectric strength in the range of 1,000 volts per mil, or more, about twice that of the above-mentioned materials.

An insulation material that could be used in the space between the emitter and detector is glass, which transmits up to about 98 percent or more of the applied light and has high dielectric strength, such as on the order of 1,000 volts per mil. Unfortunately, glass is relatively rigid and difficult to process easily using standard semiconductor processing techniques for assembly of the isolators. Moreover, some type of special structure is necessary to support the glass firmly in place in the space between the emitter and detector, and to maintain the desired alignment during subsequent assembly and system use, particularly when sudden jolts or vigorous vibrations occur. Previously, one of several known metalization procedures has been used to provide areas on the glass that can be attached to some kind of a frame in the isolator. Metalization requires steps of deposition and chemical etching, often requiring the use of various chemicals, such as acids. Such chemical treatment can contaminate the glass, so that when the latter reaches a temperature of around 80° F., residual metallic ions, such as sodium, are able to migrate from the glass surface into the detector which is in direct contact with the glass, rendering the detector incapable of functioning effectively in an isolator. Moreover, even if it were possible to thoroughly clean the glass surface of foreign ions by extensive rinsing in deionized water after the etching step, alkali ions present to some degree in any glass would be free to migrate into the detector structure under the influence of temperature and electric field, because of the direct contact between the glass and the detector.

Therefore, an improved structure, and method of making the structure, is needed wherein the transparent insulation material in the space between the emitter and the detector is of a relatively high dielectric strength, and is also compatible with standard semiconductor processing techniques so that the cost of manufacturing the isolator is not substantially increased.

BRIEF DESCRIPTION OF THE INVENTION

The device according to the invention overcomes the above-mentioned disadvantages of prior-art isolators in that it uses insulation materials in the space between the emitter and detector of the isolator that provide a relatively high dielectric strength, provide for protection from migrating alkali ions, and allow the use of standard semiconductor processing techniques for assembly, so that the cost of manufacturing individual isolators is not substantially increased.

Briefly, the device comprises a pair of sets of metal interconnect leads with a semiconductor photoemitter attached to a lead in one of the sets of leads and a semiconductor photodetector attached to a lead in the other set of leads. A portion of one set of leads overlaps a portion of the other set of leads to enable the emitter and detector to face each other while leaving a space therebetween. In the space between the emitter and detector is a layer of clear glass held firmly in place by two or more layers of transparent junction coat material.

Briefly, the method of forming the improved isolator of the invention comprises the steps of forming a pair of sets of leads, attaching an emitter die to one lead in the first set of leads and a photodetector die to one lead in the second set of leads; connecting wires between each die and other leads in the set in which the die is attached; applying a first layer of junction coat material over the exposed portion of the detector die including locations where wires are connected to the die; heating the junction coat material until it hardens; applying a second layer of junction coat material over the first layer; placing a layer of glass over the second layer; heating the second layer until it hardens; placing the second set of leads with emitter attached over the glass but spaced apart therefrom, with the emitter and detector aligned so that they face each other; filling the space between the glass and the emitter with a third layer of junction coat material; heating the third layer until it hardens; and applying moulding compound around the structure to encapsulate it.

DESCRIPTION OF THE PREFERRED EMBODIMENTS

The method of assembly of an improved optically coupled isolator capable of withstanding relatively high voltage stresses applied thereto comprises a series of steps illustrated by FIGS. 1 through 8, and 9 through 11. First, two sets of leads are selected, such as the sets of leads 5 through 7 and 10 through 12 in the respective lead frames 1 and 2 of FIGS. 9 and 10. During assembly, the lead frames 1 and 2 provide support for the leads 5 through 7 and 10 through 12. Later, the leads are detached from frames 1 and 2. Preferably, the leads are of an electrically conductive material having a low thermal coefficient of expansion, such as about $5 \times 10^{-6}$ inches per inch per degree centigrade. Suitably, the leads comprise a material such as Alloy 42 or Kovar, or an equivalent, and are about ten mils thick. A thin gold layer is deposited on a portion of the lead where the semiconductor die is to be attached and on portions of the other leads where the interconnect wires to the die are to be attached.

During formation of the lead frames, each of the outer portions of the leads, such as outer portion 13 of lead 10 (see FIGS. 1 and 10), is depressed below the general level of the frame itself by about twenty mils. This difference in elevation enables the two sets of leads, 5 through 7 and 10 through 12, to be aligned, one set over the other set, during a subsequent step.

Figure 1:
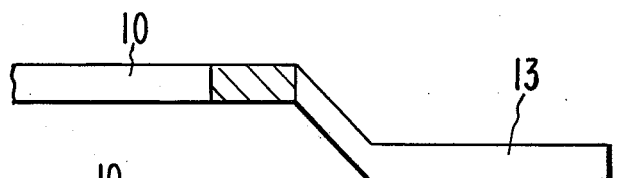
FIGS. 1 through 8 are simplified cross-sectional drawings of the isolator during steps of its assembly.
Figure 2:
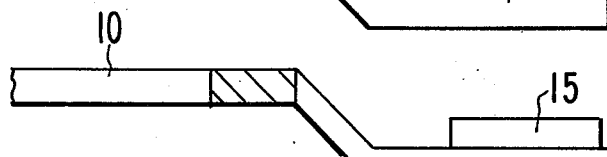
Figure 3:
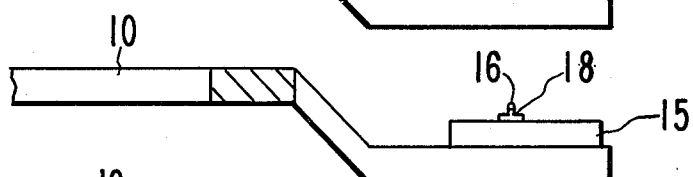
Figure 9:
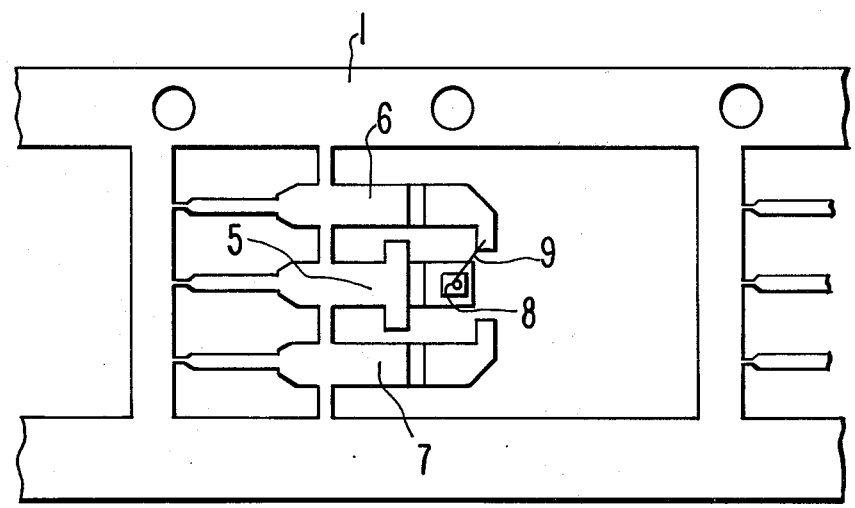
FIGS. 9 through 11 are simplified two dimensional views of intermediate steps of the assembly of the isolator, showing a lead frame with a wire connected to an emitter in FIG. 9, to a detector in FIG. 10, and a glass over the detector in FIG. 11.
Figure 10:
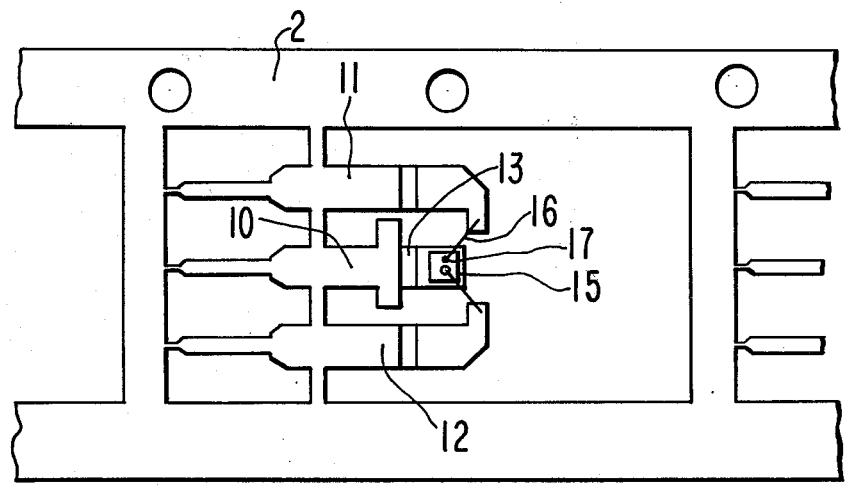

Referring to FIG. 9, the emitter die 8 is attached to the outer portion of lead 5 on frame 1, suitably using a combination of gold and germanium preform melted at a temperature of around 360° C. Referring to FIGS. 2 and 10, the detector die 15 is attached to the outer portion 13 of lead 10 in the set of leads 10 through 12 of frame 2. During attachment, a layer of silicon-gold eutectic, already present on the back of the die, is remelted, allowing gold from the lead to enter the melt, forming a strong intermetallic bond upon subsequent freezing. It will be appreciated that both die 8 and die 15 are attached to portions of the leads that are depressed about twenty mils below the frame elevation.

Electrical interconnections to the other leads in the set are provided by attaching small wires, 9 and 16, about 1.1 mils in diameter to pads on the respective die 8 and 15, using thermo-compression ball bonding techniques, and then to adjacent leads in a set, such as lead 6 on frame 1 and leads 11 and 12 on frame 2. Suitably, the pads comprise aluminum.

Figure 4:
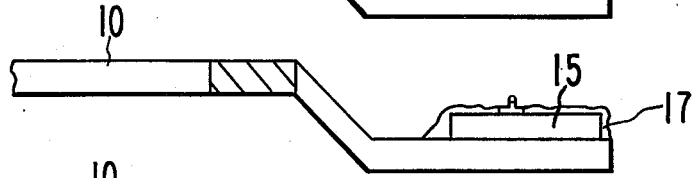

Referring to FIG. 4, a first layer 17 of transparent junction coat material, such as R6101 silicone resin, manufactured by Dow Corning Corporation, or an equivalent, is applied over the exposed surface of the detector die 15. Preferably, layer 17 is capable of transmitting 95 percent or more of the light applied thereto, has a relatively high thermal coefficient of expansion, such as about $80 \times 10^{-6}$ inches per inch degree centigrade, and has low alkali ion content. First layer 17 covers any ball bonds, such as ball bond 18, on the surface of detector die 15, and suitably is about three mils thick. The thickness of first layer 17 is grreater by one to two orders of magnitude than the typical thickness of a passivation layer over the principal surface of the detector die, which in the case of a silicon phototransistor, is silicon dioxide one micron thick. The first layer is then heated to approximately 150° C. for thirty minutes to allow it to harden.

Figure 5:
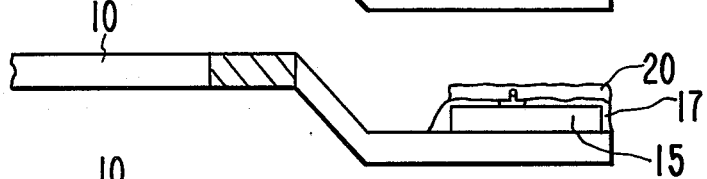

Referring to FIG. 5, a second layer 20 of the junction coat material with characteristics similar to the first layer 17 is applied over the first layer that covers the principal surface of the detector 15. Suitably, the second layer 20 is about five mils thick.

Figure 6:
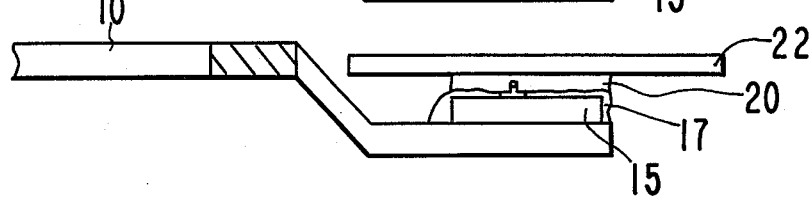
Figure 11:
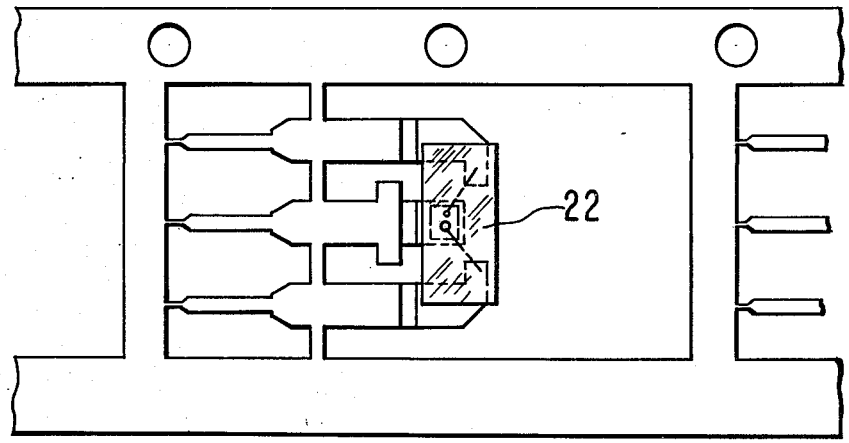

While the second layer 20 is still in a fluid state, a layer of glass 22 is placed on the second layer 20 of junction coat material as shown in FIGS. 6 and 11. The glass layer is longer and wider than the detector die 15 and, for example, its dimensions are about 200 mils long, about 100 mils wide, and approximately 6 mils thick. Preferably, glass layer 22 has a relatively high dielectric strength, such as about 1,000 volts per mil or more, and transmits 98 percent or more of the light applied to it. Suitably, glass layer 22 comprises Corning type 0211 made by Dow Corning Corporation, or an equivalent. After glass layer 22 is placed over the second layer 20, the latter is heated to approximately 150° C. for about thirty minutes to allow the second layer 20 to harden and, in effect, lock the glass layer 22 in place. Layers 17 and 20 have a combined thickness of about eight mils, and function to keep the glass layer 22 away from the thin passivation layer of silicon dioxide, for example, over the principal surface of the detector die. This combined thickness inhibits and delays any alkali ions in the glass layer from reaching the detector die and detrimentally affecting its operating characteristics.

Figure 7:
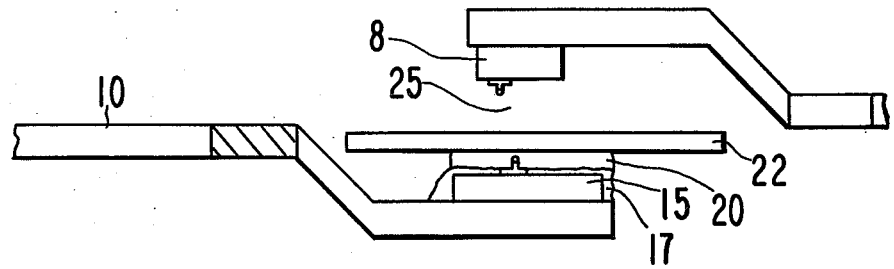

The frame 2 (see FIG. 10) with the set of leads containing the detector die 15 attached thereto and the glass layer 22 is placed on a welding fixture, with the detector die 15 facing in an upward direction. The frame 1 (see FIG. 9) with the set of leads having the emitter die 8 attached thereto is next rotated by about 180 degrees so that the emitter die 8 faces in a downward direction. Referring to FIG. 7, the two sets of leads are then positioned so that the emitter die 8 faces the detector die 15 across a space 25 therebetween.

Figure 8:
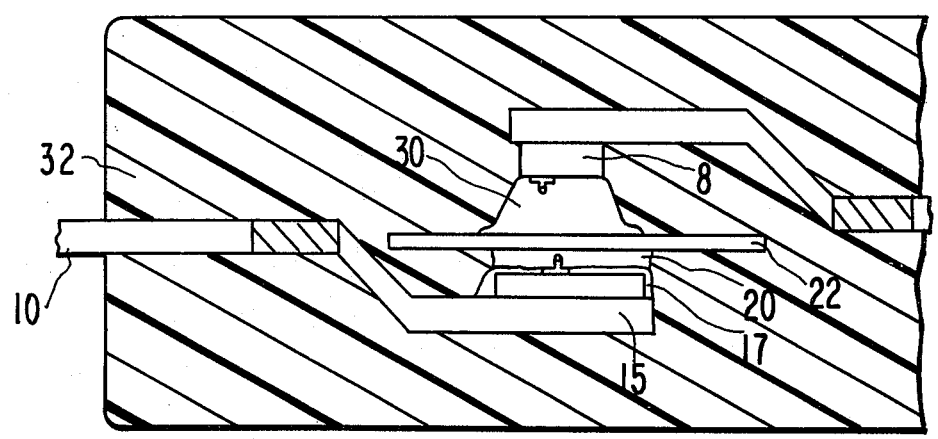

Referring to FIG. 8, a third layer 30 of junction coat material is inserted between the glass 22 and the emitter die 8. Suitably, the third layer 30 comprises the same kind of material as was used for the first and second layers 17 and 20. The third layer 30 is heated to about 150° C. for about thirty minutes until it hardens. The combination of the first and second layers 17 and 20 of junction coat material and the third layer 30 of the same material work in cooperation when hardened to hold the glass layer 22 firmly in place at the desired alignment between the emitter die 8 and detector die 15, thereby ensuring good resistance to vibration and shock during subsequent assembly steps, and during use in electronic systems.

The assembly is next encapsulated using transfer moulding techniques in order to provide environmental protection. Preferably, the moulding compound 32 selected has a low thermal coefficient of expansion, such as in the range of $30 \times 10^{-6}$ inches per inch per degree centigrade. Suitably, the compound 32 consists of DC-308 made by Dow Corning, MC-506 made by General Electric, or an equivalent. Preferably the thermal coefficient of expansion of the moulding compound 32 and of the leads 5 through 7 and 10 through 12 is less than that of the junction coat material used in the first, second, and third layers 17, 20, and 30. During subsequent assembly steps, the frames 1 and 2 are removed from the leads 5 through 7 and 10 through 11 by the use of cropping and crimping dies.

The steps of assembling the optically coupled isolator incorporates known semiconductor processing techniques and does not substantially increase the assembly cost. Use of a layer of glass with a high dielectric strength enables isolation voltages to be in the range of 5,000 to 8,000 volts, without electrical connection between the emitter and detector occurring. Moreover, the junction coat material used to cover both die and to hold the glass layer firmly in place eliminates the need for special metalization, which can cause unwanted contamination of the glass. Also, the combined thickness of the first two layers of junction coat material, which have low alkali ion content, inhibit and delay migration of alkali ions, such as sodium, from the glass layer to the detector and unwanted subsequent deterioration from occuring in the detector's operating characteristics, Furthermore, the length of the space between the emitter and detector has not changed, enabling the assembly to fit easily into standard size semiconductor dual in-line packages. In addition, the glass does not touch the detector or the emitter so that the ball bonds on each are not damaged nor destroyed.

We claim:

1. A method of increasing the capability of an optically coupled isolator to withstand high voltage stresses applied thereto, the steps comprising:

forming a plurality of sets of electrically conductive leads;

attaching a semiconductor light detector to a lead in one set and a semiconductor light emitter to a lead in another set;

attaching electrically conductive wires between the detector and leads in the set in which the detector is attached;

attaching electrically conductive wires between the emitter and leads in the set in which the emitter is attached;

applying a first layer of junction coat material over the exposed portion of the detector including over locations where the wires are attached to the detector;

heating the first layer until it hardens;

applying a second layer of junction coat material over the first layer;

placing a layer of glass on the second layer;

heating a second layer until it hardens;

placing the set of leads containing the emitter over the set of leads containing the detector so that the emitter faces the detector across a space therebetween;

applying a third layer of junction coat material in the space between the glass and the emitter; and, heating the third layer until it hardens.

2. The method of claim 1 further defined by the additional step, after the step of heating the third layer, of encapsulating the structure with a moulding compound.

* * * * *